United States Patent [19]

Shibata et al.

[11] Patent Number: 4,710,936
[45] Date of Patent: Dec. 1, 1987

[54] OPTOELECTRONIC SEMICONDUCTOR DEVICE

[75] Inventors: Jun Shibata, Sakai; Hiroyuki Serizawa, Hirakata, both of Japan

[73] Assignee: Matsushita Electric Industrial Co., Ltd., Kadoma, Japan

[21] Appl. No.: 722,586

[22] Filed: Apr. 12, 1985

[30] Foreign Application Priority Data

Apr. 12, 1984 [JP] Japan ................................ 59-73380

[51] Int. Cl.$^4$ .............................................. H01S 3/19
[52] U.S. Cl. ......................................... 372/45; 357/16; 357/17; 357/34; 372/46; 372/48; 372/50
[58] Field of Search ...................... 372/50, 46, 45, 48; 357/34, 17, 16

[56] References Cited

U.S. PATENT DOCUMENTS

| 3,278,814 | 10/1966 | Rutz | 357/17 |
| 3,369,132 | 2/1968 | Fang et al. | 307/299 |
| 4,430,741 | 2/1984 | Fukuzawa et al. | 372/46 |
| 4,513,423 | 4/1985 | Katz et al. | 372/50 |

FOREIGN PATENT DOCUMENTS

| 42-5572 | 3/1967 | Japan . | |
| 0016590 | 2/1978 | Japan | 372/48 |
| 0164591 | 10/1982 | Japan | 372/50 |

OTHER PUBLICATIONS

C. P. Lee, S. Maralit, I. Ury and A. Yariv, "Integration of an Injection Laser with Gunn Oscillator on a Semi--Insulating GaAs Substrate", 6/15/78, Amer. Institute of Physics—pp. 806-807.
I. Ury, S. Margalit, M. Yust and A. Yariv, "Monolithic Integration of an Injection Laser and a Metal Semiconductor Field Effect Transistor", 4/1/79, Amer. Institute of Physics—pp. 430-431.
U. Koren, K. L. Yu, T. R. Chen, N. Bar-Chaim, S. Margalit & A. Yariv, "Monolithic Integration of a Very Low Threshold Gain ASP Laser and Metal-Insulator-Semiconductor Field-Effect Transistor on Semi-Insulating InP", 4/15/82, Amer. Institute of Physics—pp. 643-645.
Jun Shibata, Ichiro Nakao, Yoichi Sasai, Soichi Kimura, Nobuyasu Hase and Hiroyuki Serizawa, "Monolithic Integration of an InGaAsP/InP Laser Diode with Heterojunction Bipolar Transistors", 8/1/84, Amer. Institute of Physics—pp. 191-193.

*Primary Examiner*—James W. Davie
*Attorney, Agent, or Firm*—Wenderoth, Lind & Ponack

[57] ABSTRACT

A semiconductor laser device has a double hetero construction such that a direct transition type semiconductor layer having a high refractive index is placed between direct transition type semiconductor layers having a low refractive index, and has an optical resonator formed in the direct transition type semiconductor layer of a high refractive index for enabling lasing operation. The condition of lasing is controllable by the transistor of the double hetero construction. The semiconductor laser device is of transistor structure and yet it constitutes integrated circuits for lasing. As an optoelectronic device, it can be advantageously employed in optical-fiber communication systems and optical information systems.

11 Claims, 12 Drawing Figures

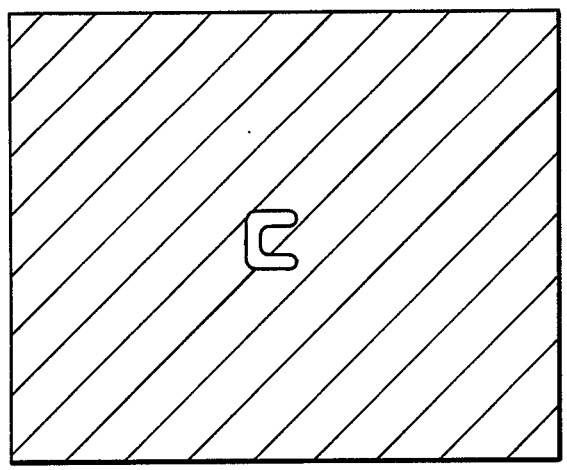
FIG. 3(a).    Vcc = 10v
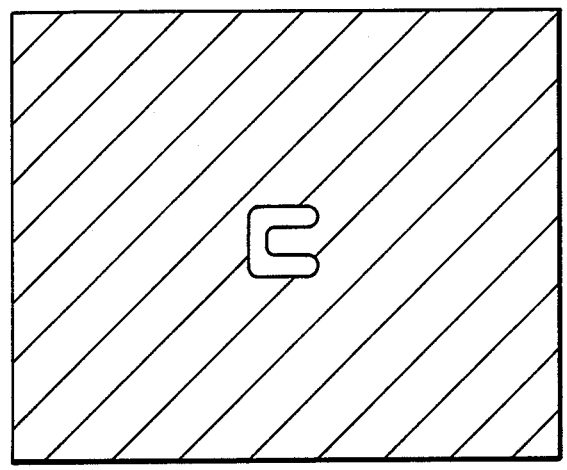
FIG. 3(b).    Vcc = 5v
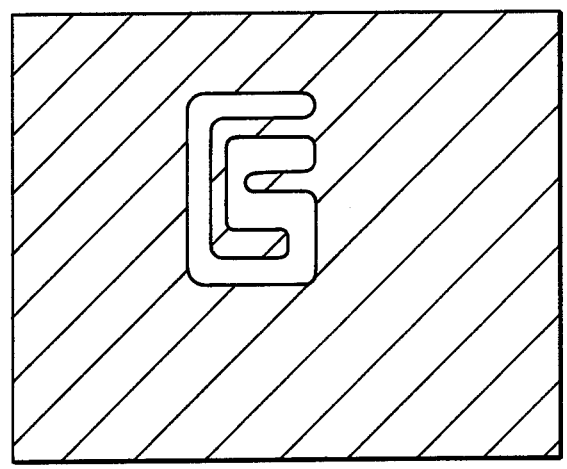
FIG. 3(c).    Vcc = 0v

OPTOELECTRONIC SEMICONDUCTOR DEVICE

BACKGROUND OF THE INVENTION

This invention relates to optoelectronic semiconductor devices, such as semiconductor laser diodes and light emitting diodes.

In various industrial fields, such as optical fiber communication systems and information systems, active efforts have been directed to the utilization of optoelectronic semiconductor devices, including semiconductor laser diodes and light emitting diodes, as key parts of such systems in order to accomplish large capacity information transmission. An optoelectronic semiconductor devices are element for converting electric signals into optical signals. Hence, attempts to arrange a signal processing circuit and optoelectronic semiconductor devices in an integrated relationship on a single substrate have recently been attracting wide attention. Such integrated circuits in which optoelectronic devices and electronic devices are integratedly arranged are called optoelectronic integrated circuits (OEIC). As a pioneer development in the field of OEIC, C. P. Lee, S. Margalit, I. Ury, and A. Yariv proposed to integrate a semiconductor laser diode and a gunn diode together on a semi-insulating GaAs (gallium arsenide) substrate, which proposal was disclosed in Applied Physics Letter 32 (12) pp 806–807 (1978). Thereafter, in Applied Physics Letter 34 (7) pp 430–431 (1979), I. Ury, S. margalit, M. Yust, and A. Yariv disclosed a semiconductor laser diode with driving circuits (LD/Driver) which comprises a semiconductor laser diode and a metal semiconductor field effect transistor (MESFET) arranged integratedly on a semi-insulating GaAs substrate.

According to the type of semiconductor substrate used, OEIC can be classified into two types; one using a GaAs substrate and the other using an indium phosphide (InP) substrate. Further-more, by the type of electronic devices integrated into the circuit, the classification is such that a MESFET is used with a GaAs substrate, while a metal insulator semiconductor field effect transistor (MISFET) is used with an InP substrate. A pioneer embodiment using a MISFET was disclosed by U. Koren, K. L. Yu, T. R. Chenn N. Bar-Chaim, S. Margalit, and A. Yariv in Applied Physics Letter 40 (8) pp 643–645 (1982). The present inventors developed an LD/Driver comprising an InP substrate and a hetero-junction bipolar transistor (HBT) as an electronic device, which was disclosed in Applied Physics Letter 45 (3) pp 191–193 (1984). As far as the integration of an HBT on an InP substrate is concerned, the LD/Driver developed by the present inventors was a pioneer one.

In the course of their research into OEICs utilizing an HBT, the inventors found that the HBT emits light in a base layer if a bias voltage is suitably selected. That is, as the supply voltage for a switch circuit using an HBT is varied, the base layer of the transistor emits light, with a varying intensity of light emission. The OEIC using an indium phosphide/indium gallium arsenide phosphide substrate as disclosed by the present inventors in Applied Physics Letter 45 (8) pp 191–193 (1984) have such an HBT integrated therein. The intensity of aforesaid light emission from the base layer depends upon the operational region of the HBT. If the supply voltage is high, the operational region of the HBT is in an active region in which the recombination of minority carriers in the base layer is unlikely to take place, so that the intensity of light emission is lower. Conversely, if the supply voltage is low, the operational region of the HBT is in a saturation region in which excess minority carriers are injected from both an emitter and a collector into the base layer and thus recombination of electrons with holes takes place in the base layer, so that the intensity of light emission becomes higher.

This invention is based on the principle of such light emission in the base layer of the aforesaid HBT. That is, the invention is such that a light-reflective resonator (e.g., Faby-Perot resonator) is formed in a base layer of an HBT, whereby lasing, i.e., the emission of a laser beam, is made possible. The control of the lasing is effected by controlling a base current.

Prior to the present invention, disclosed devices having such multiple functions as described above were described in Japanese Patent Publication No. 42-5572 (published Mar. 7, 1967), U.S. Pat. No. 3,369,132 (issued Feb. 3, 1968), and U.S. Pat. No. 3,278,814 (issued Oct. 11, 1966). In Japanese Patent Publication No. 42-5572, there is teaching as to light emission between a base layer and a collector layer in an npn type or pnp type bipolar transistor using a GaAs semiconductor material. This prior art device has disadvantages in that the arrangement of the device requires diffusion of n-type and p-type impurities into the GaAs substrate, a technique rather impracticable in the state of the art. U.S. Pat. Nos. 3,369,132 and 3,278,814 disclose a pnp-type or npn-type bipolar structure, as is the case with Japanese Patent Publication No. 42-5572, but these disclosures relate merely to a device arranged such that light emitted between a base and an emitter is absorbed between the base and a collector for supply as an external output current.

SUMMARY OF THE INVENTION

Accordingly, it is a first object of the present invention to provide an optoelectronic semiconductor device including an HBT wherein the emitter and collector layers of the HBT are of a material which has a band gap energy which is higher than that of the base layer thereof, and wherein the base layer serves as a light emission area.

It is a second object of the invention to provide an optoelectronic semiconductor device including an HBT wherein a base layer of the HBT has an optical resonator to thereby permit lasing.

It is a third object of the invention to provide a functionally integrated device incorporating an HBT with a wide gap emitter and a wide gap collector and which has both a lasing function and a transistor function.

It is a fourth object of the invention to provide an optoelectronic device incorporating an HBT with a wide gap emitter and a wide gap collector and which eliminates a pattern effect by the sinking into the collector layer of minority carriers used for light emission in the base layer and thus permits high speed switching.

These and other objects are accomplished by an optoelectronic semiconductor device comprising a bipolar transistor including a first-conductive type emitter layer, a second-conductive type base layer, and a first-conductive type collector layer. The base layer is formed of a direct transition type semiconductor and has a band gap energy which is made lower than the band gap energy of both the emitter and collector layers and has a refractive index which is made higher than the refractive index of both the emitter and collector layers each. Furthermore, the base layer is capable of emitting light when a bias voltage is applied to the transistor.

In a specific embodiment, the base layer has its band gap energy made lower than the band gap energy of the collector layer and has its refractive index made higher than the refractive index of the emitter layer. Furthermore, the base layer has an optic resonator. The optic resonator consists of a pair of opposed light-reflective ends of the base layer. This pair of opposed ends of the base layer is formed by cleavage or grating.

The invention relates also to an optoelectronic semiconductor device comprising a bipolar transistor including a collector layer, and a base layer and an emitter layer, both formed on the collector layer in a selective pattern. The base layer has a reflective surface which forms a resonator and is capable of emitting light when a bias voltage is applied to the transistor.

In a specific embodiment, the base layer has zinc or cadmium electrodes formed thereon by thermal diffusion or ion implanation effected through the emitter layer until the zinc or cadmium reaches the base layer. On the collector layer, there are selectively provided a plurality of hetero-junctions of the base layer and emitter layer. The base layer of each hetero-junction has an optics resonator. Further-more, the base layer has one portion selectively made thicker than the remaining portion of base layer so that electron injection from the emitter layer is selectively effected into the thicker portion of the base layer. That is, the portion selectively made thicker is set to be the thickest in the base layer.

Furthermore, the invention relates to an optoelectronic semiconductor device comprising a bipolar transistor including a collector layer, and a base layer and an emitter layer, sequentially formed on the collector layer in a selective pattern, semiconductor layers provided on sides of said base layer and emitter layer. The semiconductor layers is formed of and by filling up spaces on said sides with a semiconductor material of the same conductivity type as the base layer but which has a lower refractive index and a higher band gap energy than those of the base layer. The base layer is capable of emitting light when a bias voltage is applied to the transistor.

In a specific embodiment, the base layer has an optic resonator. The embodiment is designed so that supply of a base current to the base layer is made through semiconductor layers formed on both sides of the base layer and emitter layer by filling up spaces on said both sides with a semiconductor material. The base layer has a plurality of base electrodes.

This invention provides various advantages, among which are as follows:

(1) The base layer of the bipolar transistor which constitutes the optoelectronic semiconductor device may be of a double-hetero structure to permit effective carrier confinement.

(2) The base layer of the bipolar transistor is formed of a material having a low refractive index, whereby confinement of light can be effectively achieved.

(3) The base layer is provided with resonators to permit confinement of light by reflecting same.

(4) It is possible to provide an optoelectronic semiconductor device by forming mirror resonators on the base layer of a double hetero-junction bipolar transistor.

(5) Where mirror resonators are not formed on the base layer, it is possible to provide an optoelectronic semiconductor device having a switch function which permits spontaneous emission.

(6) Where a plurality of base-emitter junctions are formed on a common collector layer, it is possible to provide a so-called multi-emitter transistor and to control a plurality of light emissions.

(7) Formation of a hetero-junction bipolar transistor on a semiconductor substrate, facilitates integration of optoelectronic devices and electric devices in plurality.

(8) Where a graft base layers are formed of impurities having a high diffusion coefficient, such as zinc or the like, it is possible to provide a narrower gain guide by taking advantage of a autodoping effects of the impurities, and thus to stabilize a transverse mode.

While the novel features of the invention are set forth with particularity in the appended claims, the invention, both as to organization and content, will be better understood and appreciated, along with other objects and features thereof, from the following detailed description taken in conjunction with the drawings.

BRIEF DESCRIPTION OF THE DRAWINGS

FIGS. 3(a), 3(b), and 3(c) are views showing modes of light emission by the hetero-junction bipolar transistor;

DETAILED DESCRIPTION OF THE INVENTION

This invention, based on findings as to the phenomenon of light emission from a hetero-junction bipolar transistor, provides an optoelectronic device of transistor construction.

Before description is made of the embodiments of the invention, findings with the phenomenon of light emission from a hetero-junction bipolar transistor on which findings this invention is based will be elucidated.

Figure 1:
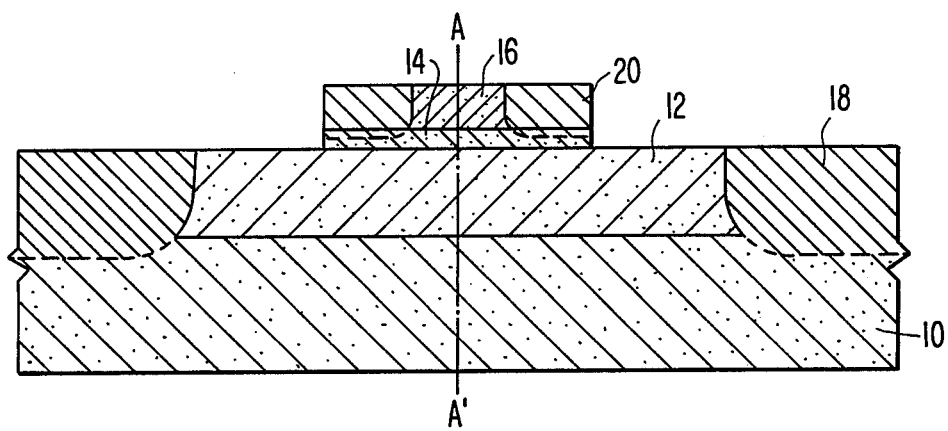
FIG. 1 is a sectional view showing a hetero-junction bipolar transistor on which the present invention is based.

FIG. 1 shows a sectional configuration of a hetero-junction bipolar transistor. Numeral 10 designates a p-type InP substrate, and 12 designates an n-type InP epitaxial layer which represents a collector layer. Shown by 14 is a p-type InGaAsP epitaxial layer representing a base layer. Numeral 16 is an n-type Inp epitaxial layer which represent an emitter layer. Numerals 18 and 20 represent thermal diffusion (ion implantation) layers of zinc or cadmium, which respectively function as isolation areas or graft base layers.

Figure 2A:
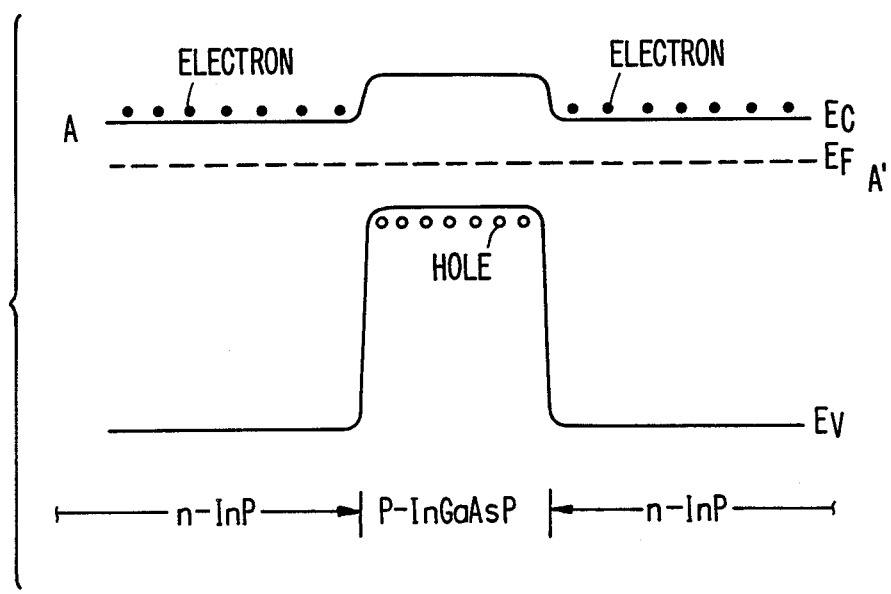
FIGS. 2(a), 2(b), and 2(c) are views showing energy bands corresponding to various different states of the transistor, i.e., thermal equilibrium, active, and saturation.
Figure 2B:
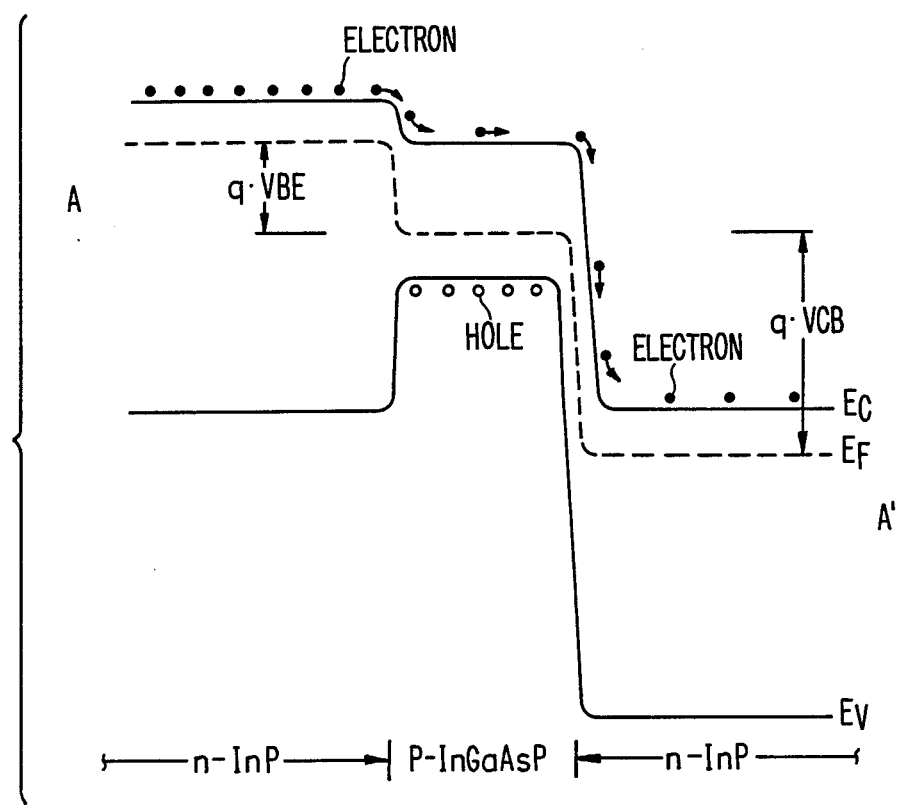
Figure 2C:
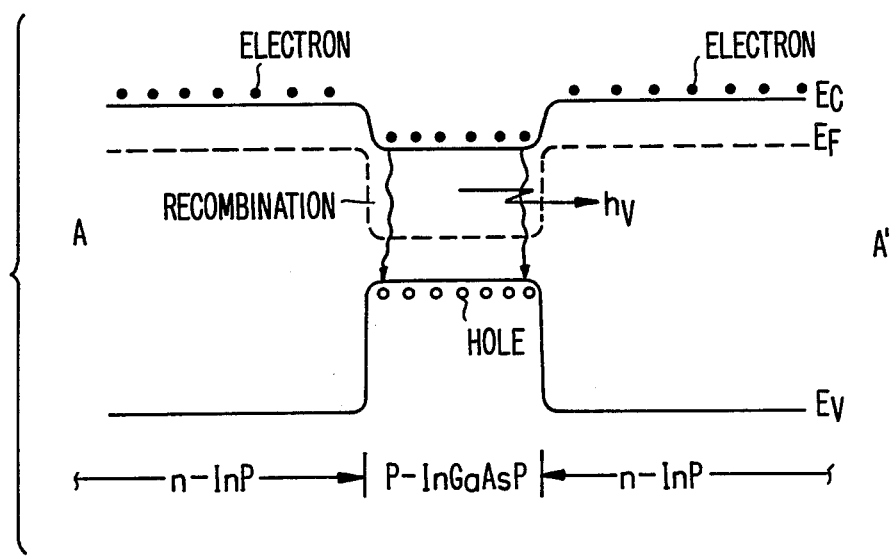

FIGS. 2(a), 2(b), and 2(c) are views showing energy bands taken along the dash line A—A' in FIG. 1; FIG. 2(a) shows an energy band in equilibrium state, FIG. 2(b) shows an energy band in active state, and FIG. 2(c) shows an energy band in saturation state. $E_F$ represents the Fermi level, $E_C$ represents a conduction band, and $E_V$ represents a valence band. If a forward bias voltage $V_{BE}$ is applied across the base and emitter of a hetero-junction bipolar transistor, and if a reverse bias voltage $V_{CB}$ is applied across the base and collector, the transistor goes into its active state. Electron injection from the emitter into the base is of a magnitude proportional to index Exp. ($\Delta Eg/kT$) of band gap energy differential $\Delta Eg = Eg(InP) - Eg(InGaAsP)$ between InP and InGaAsP. Therefore, the emitter efficiency $\gamma$ has a value very close to 1. Electrons injected into the base are sunk by the electric field in a depletion area between the base and the collector and thus captured into the collector layer.

FIG. 2(b) shows a band model showing operation of the transistor described above.

Such a hetero-junction transistor is different from a homo-junction bipolar transistor in that holes in the base layer are confined by valence bands of the emitter and collector. Thus, the current carriers in a hetero-junction bipolar transistor are only electrons. Therefore, a hetero-junction bipolar transistor is operable as a switch device having a large $h_{FE}$ and a high speed. Whilst, if the bias voltage is at its saturation state, the band model will be as shown in FIG. 2(c). That is, in the state of saturation, the bias voltage is applied in the forward direction between the base and the emitter and between the base and the collector. Consequently, electrons are injected into the base layer from the emitter and collector layers in manner as illustrated in FIG. 2(c). Meanwhile, holes are under confinement by valence bands of the emitter and collector. Electrons are confined in a quantum well. Hence, recombination of electrons and holes takes place, with the result of a light emission of a wavelength proportional to the band gap energy.

Figure 4:
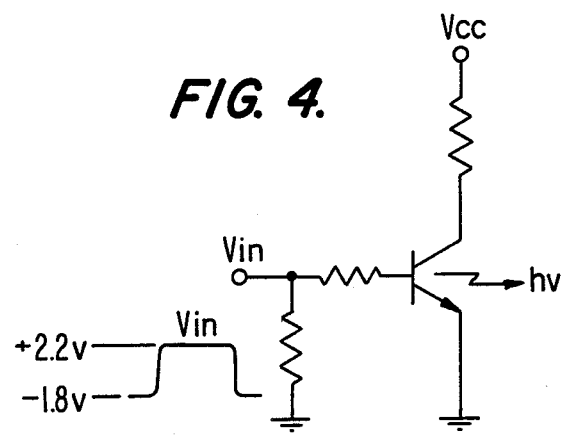
FIG. 4 is a connection diagram showing a circuit in which the modes of light emission in FIGS. 3(a), 3(b), and 3(c) are observed.

FIGS. 3(a), 3(b), and 3(c) show light emission as observed at emitter - base junctions in a switch circuit shown in FIG. 4 using a hetero-junction bipolar transistor, when the supply voltage Vcc in the circuit is set to 10 v, 5 v, and 0 v in that order. The hetero-junction bipolar transistor used in this instance is such that the base - collector junction is a homo-junction. The configuration shown in FIG. 1 is of a double hetero-junction. Shown in FIG. 3 are observations with a single hetero-junction transistor. Even with a single hetero-junction transistor, light emission in the base layer was observed as shown, through the confinement of electrons and holes. This means that more efficient light emission will take place where a double hetero-junction is employed. It is noted that as FIGS. 3(a), 3(b), and 3(c) illustrate, the intensity of light emission varies according to the magnitude of supply voltage. The reason is that if the supply voltage supplied to the collector is large, the current flow in the collector is large. That is, since a collector current is a stream of carriers generated by electrons injected from the emitter layer into the base layer, the electrons confined into the base layer of the transistor decrease in number with the flow of a collector current. Therefore, the number of electrons available for recombination is small and accordingly the intensity of light emission is diminished. In contrast, if the supply voltage applied to the collector is 0 v, there is no flow of collector current, and accordingly the intensity of light emission becomes higher, as FIG. 3(c) indicates. If the supply voltage is higher than 10 v, a voltage shown in FIG. 3(a), the HBT goes out of its saturation state and into its active state, and accordingly light emission stops.

This invention, made on the basis of the above described experimental results, is such that, for example, a light reflector is provided in the base layer for resonance purposes, whereby laser radiation is emitted from the base layer of the hetero-junction bipolar transistor, the intensity of the laser radiation being controllable by the transistor.

Figure 5:
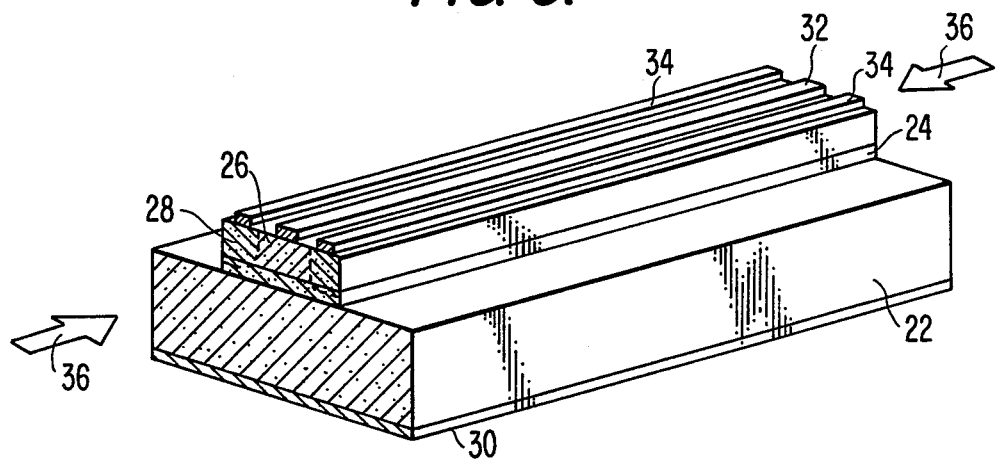
FIG. 5 is a perspective view showing a semiconductor laser in a first embodiment of the invention.
Figure 6:
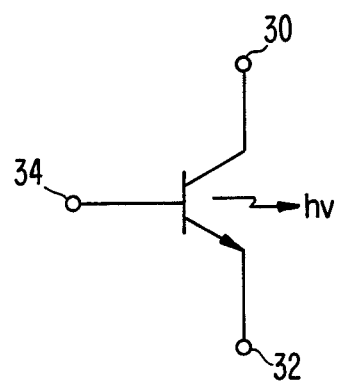
FIG. 6 is an equivalent circuit for the semiconductor laser in FIG. 5.

FIG. 5 shows a first embodiment (semiconductor laser device) of the invention. Numeral 22 designates a collector layer (n - InP layer), 24 a base layer (p - InGaAsP layer), 26 an emitter layer (n - InP layer), 28 a graft base layer, and 30 a collector electrode formed of an Au/Sn type metal. Numeral 32 is an emitter electrode formed of an Au/Sn type metal. Shown by 34 is a base electrode formed of an Au/Zn type metal. Designated by 36 is mirror resonator surfaces formed by crystal cleavage. That is, specifically speaking, both opposed light-reflective end surfaces of base layer 24 form an optical resonator. FIG. 6 shows an equivalent circuit for the FIG. 5 arrangement. A base layer of a double hetero or single hetero structure, provided with a mirror resonator, emits laser radiation when the hetero-junction transistor is in its saturation state. In this case, the base layer acts as an optical wave guide for a gain guide; therefore, it is rather difficult to obtain a single transverse mode.

Figure 7:
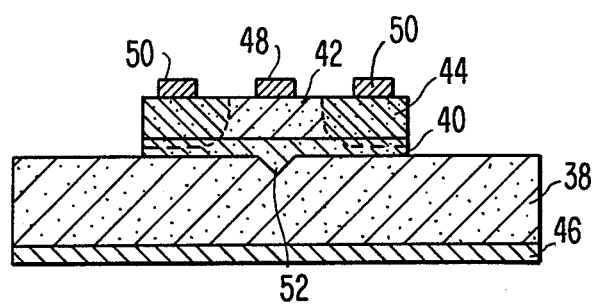
FIG. 7 is a sectional view showing a second embodiment of the invention.

FIG. 7 illustrates a second embodiment of the invention. In FIG. 7, numeral 38 designates a collector layer (n - InP layer), 40 designates a base layer (p - InGaAsP layer), 42 designates an emitter layer (n - InP layer), 44 designates a graft base layer, 46 designates a collector electrode, 48 an emitter electrode, 50 designates base electrodes, and 52 designates a recessed portion of the base layer 40. The provision of a V-shaped recessed portion 52 in the base layer 40 makes it possible to confine light by virtue of a gain guide and an index guide, so that a stable single transverse mode can be obtained. That is, the light is emitted from the recessed portion 52 of base layer 40 stably.

Figure 8:
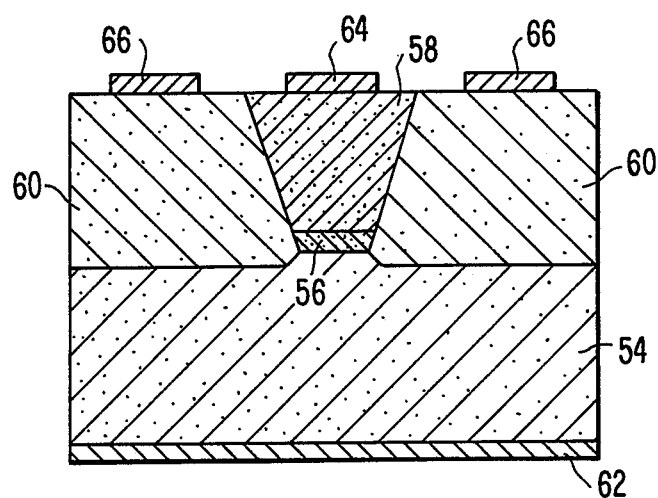
FIG. 8 is a sectional view showing a third embodiment of the invention.

FIG. 8 shows a third embodiment of the invention. In this embodiment, a hetero - junction bipolar transistor is employed. In FIG. 8, numeral 54 designates a collector layer (n - Inp layer), 56 designates a base layer (p - InGaAsP layer), 58 designates an emitter layer (n -InP layer), 60 designates graft base layers (p - InP layer), 62 designates a collector electrode, 64 designates an emitter electrode, and 66 designates base electrodes. The arrangement shown in FIG. 8 is a so-called buried heterostructure. A base layer 56 and an emitter layer 58 are sequentially caused to epitaxially grow on a collector layer 54, and subsequently, a projected portion is formed by selectively ethcing the emitter and base layers. Then, spaces adjacent to the projected portion are filled up with a p - InP layer or graft base layer 60 so that the projected portion is buried by the graft base layer 60. Since the base layer 56 is covered therearound with the InP layer, a layer having a low refractive index, confinement of light is effectively achieved and thus, a stable mode is obtained. The junction between graft base layer 60 and emitter layer 58 is homo-junction and, therefore, has a higher built-in voltage than the hetero-junctions. Thus, most of the electrons injected from the emitter will flow toward the hetero junctions. Furthermore, the fact that the base layer 60 is high in concentration and thick contributes to decreasing the resistance of the base layer. In addition, the autodoping of the impurity from graft base layer to other crystal layer permits effective electrical connection between the graft base layer 60 and the base layer 56.

In the above described embodiments, InGaAsP/InP type hetero-junctions are employed, but hetero-junctions of other types, such as InGaAs/InP, GaAlAs/GaAs, and InAlAsP/InP, can be effectively employed as well. Also, it is possible to employ a pnp structure instead of the npn structure. Further, it is noted that a mirror resonator can be formed not only by crystal cleavage, but also by grating. For that purpose, it is possible to form an optical wave guide in the base layer.

While specific embodiments of the invention have been illustrated and described herein, it is realized that modifications and changes will occur to those skilled in the art. It is therefore to be understood that the appended claims are intended to cover all modifications and changes as fall within the true spirit and scope of the invention.

What is claimed is:

1. In an optoelectronic semiconductor device, the improvement comprising:
   a bipolar transistor including,
      a collector layer of a first type of conductivity;
      a base layer of a second type of conductivity disposed on said collector layer, and
      an emitter layer of said first type of conductivity disposed on said base layer;
   current supplying layers disposed on both sides of said base layer and composed of a semiconductor material of said second type of conductivity, said current supplying layers being electrically coupled to said base layer for supplying current thereto; and
   base electrodes respectively disposed on said current supplying layers;
   said base layer being composed of a direct transition type semiconductor and having a band gap energy which is lower than the band gap energy of both said emitter and collector layers and having a refractive index which is higher than the refractive index of both said emitter and collector layers;
   wherein said base layer emits light when said current is supplied to said base layer through at least one of said base electrodes.

2. An optoelectronic semiconductor device as set forth in claim 1, wherein said base layer includes an optical resonator.

3. An optoelectronic semiconductor device as set forth in claim 2, wherein said optical resonator comprises a pair of opposed light-reflective end surfaces of said base layer.

4. An optoelectronic semiconductor device as set forth in claim 3, wherein said pair of opposed end surfaces of said base layer are formed by cleavage or grating.

5. An optoelectronic semiconductor device as set forth in claim 1, wherein said current supplying layers have a refractive index which is lower than that of said base layer.

6. In an optoelectronic semiconductor device, the improvement comprising:
   a bipolar transistor including,
      a collector layer of a first type of conductivity;
      a base layer of a second type of conductivity disposed on said collector layer, and
      an emitter layer of said first type of conductivity disposed on said base layer;
   current supplying layers disposed on both sides of said base layer and composed of a semiconductor material of said second type of conductivity, said current supplying layers being electrically coupled to said base layer for supplying current thereto; and
   base electrodes respectively disposed on said current supplying layers;
   said base layer being composed of a direct transition type semiconductor and having a band gap energy which is lower than the band gap energy of both said emitter and collector layers and having a refractive index which is higher than the refractive index of both said emitter and collector layers;
   wherein said base layer emits light when said current is supplied to said base layer through at least one of said base electrodes;
   and wherein said base electrodes are formed on said respective current supplying layers by thermal diffusion or ion implantation effected through said emitter layer until the zinc or cadmium reaches said current supplying layers.

7. An optoelectronic semiconductor device as set forth in claim 6, wherein a plurality of hetero-junctions of said base layer and emitter layer are selectively provided on said collector layer, and wherein a base layer of each hetero-junction includes an optical resonator.

8. An optoelectronic semiconductor device as set forth in claim 6, wherein said base layer has a portion selectively made thicker than the remaining portion of said base layer so that electron injection from said emitter layer is selectively effected into said thicker portion of said base layer.

9. In an optoelectronic semiconductor device, the improvement comprising:
   a bipolar transistor including,
      a collector layer of a first type of conductivity;
      a base layer of a second type of conductivity disposed on said collector layer, and
      an emitter layer of said first type of conductivity disposed on said base layer;
   current supplying layers disposed on both sides of said base layer and composed of a semiconductor material of said second type of conductivity, said current supplying layers being electrically coupled to said base layer for supplying current thereto; and
   base electrodes respectively disposed on said current supplying layers;
   said base layer being composed of a direct transition type semiconductor and having a band gap energy which is lower than the band gap energy of both said emitter and collector layers and having a refractive index which is higher than the refractive index of both said emitter and collector layers;
   wherein said base layer emits light when said current is supplied to said base layer through at least one of said base electrodes and wherein the amount of light emitted is controlled by selectively varying the amount of current supplied to said layer by each of said base electrodes.

10. An optoelectronic semiconductor device as set forth in claim 9, wherein said base layer includes an optical resonator.

11. In an optoelectronic semiconductor device, the improvement comprising:
   a bipolar transistor including,
      a collector layer of a first type of conductivity;
      a base layer of a second type of conductivity disposed on said collector layer, and
      an emitter layer of said first type of conductivity disposed on said base layer;

current supplying layers disposed on both sides of said base layer and composed of a semiconductor material of said second type of conductivity, said current supplying layers being electrically coupled to said base layer for supplying current thereto; and base electrodes respectively disposed on said current supplying layers;

said base layer being composed of a direct transition type semiconductor and having a band gap energy which is lower than the band gap energy of both said emitter and collector layers and having a refractive index which is higher than the refractive index of both said emitter and collector layers;

wherein said base layer emits light when said current is supplied to said base layer through at least one of said base electrodes and wherein the amount of light emitted is controlled by selectively varying the amount of current supplied to said layer by each of said base electrodes;

and wherein said base electrodes are formed of zinc or cadmium formed by thermal diffusion or ion implantation effected through said emitter layer until said zinc or cadmium reaches said current supplying layers.

* * * * *